United States Patent
Kang et al.

(10) Patent No.: US 9,541,952 B2
(45) Date of Patent: Jan. 10, 2017

(54) DISPLAY APPARATUS

(71) Applicant: LG ELECTRONICS INC., Seoul (KR)

(72) Inventors: Kitae Kang, Seoul (KR); Hyunjong Ryu, Seoul (KR); Jaehyun Sung, Seoul (KR); Sangdon Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 408 days.

(21) Appl. No.: 14/010,716

(22) Filed: Aug. 27, 2013

(65) Prior Publication Data

US 2014/0226266 A1 Aug. 14, 2014

(30) Foreign Application Priority Data

Feb. 8, 2013 (KR) .................. 10-2013-0014478

(51) Int. Cl.
| | | |
|---|---|---|
| *H05K 7/00* | (2006.01) | |
| *H05K 5/00* | (2006.01) | |
| *G06F 1/16* | (2006.01) | |
| *H01L 51/00* | (2006.01) | |
| *H05K 5/02* | (2006.01) | |
| *H04N 5/64* | (2006.01) | |
| *G02F 1/1333* | (2006.01) | |

(52) U.S. Cl.
CPC ......... *G06F 1/1601* (2013.01); *H01L 51/0097* (2013.01); *H04N 5/64* (2013.01); *H05K 5/02* (2013.01); *G02F 1/133305* (2013.01); *H01L 2251/5338* (2013.01); *Y02E 10/549* (2013.01)

(58) Field of Classification Search
CPC ................................ G09G 3/00; G09G 3/3225

USPC .................................. 361/679.01–679.03
See application file for complete search history.

(56) References Cited

U.S. PATENT DOCUMENTS

| | | | | |
|---|---|---|---|---|
| 4,949,585 A | * | 8/1990 | Dauvegne | B60N 2/0224 254/102 |
| 4,958,521 A | * | 9/1990 | Morimoto | G01N 19/04 73/150 A |
| 2011/0249425 A1 | * | 10/2011 | Aurongzeb | F21V 14/02 362/102 |
| 2011/0317293 A1 | * | 12/2011 | Shiga | G02B 7/102 359/824 |

FOREIGN PATENT DOCUMENTS

| | | | |
|---|---|---|---|
| CN | 1819416 A | | 8/2006 |
| CN | 102342012 A | | 2/2012 |
| CN | 102812291 A | | 12/2012 |
| EP | 2 312 563 A1 | | 4/2011 |
| JP | 2006-23676 A | | 1/2006 |
| JP | 2006023676 A | * | 1/2006 |
| JP | 2009-20168 A | | 1/2009 |
| JP | 2009109812 A | * | 5/2009 |

* cited by examiner

*Primary Examiner* — Jerry Wu
(74) *Attorney, Agent, or Firm* — Dentons US LLP

(57) ABSTRACT

A display apparatus includes a display module including a flexible display panel for displaying an image, and a variable member for varying a shape of the flexible display panel. The variable member includes a variable section capable of bending in shape. The variable member also includes a driver for supplying mechanical energy to bend the shape of the variable section, where the flexible display panel is varied in shape by the bending in shape of the variable section.

19 Claims, 6 Drawing Sheets

DISPLAY APPARATUS

CROSS-REFERENCE TO RELATED APPLICATION

This application claims the priority benefit of Korean Patent Application No. 10-2013-0014478 filed on Feb. 8, 2013 in the Korean Intellectual Property Office, the disclosure of which is incorporated herein by reference.

BACKGROUND

1. Field of the disclosure

The present disclosure relates to a display apparatus, and more particularly to a display apparatus with an improved structure.

2. Description of the Related Art

Various types of display apparatuses are used to display images. For example, there are various displays such as a liquid crystal display panel, a plasma display panel, and an organic light emitting diode display panel.

In accordance with recent expansion of application fields of display apparatuses, diverse characteristics of display apparatuses are now required in the application fields. In particular, such requirements have been increased in association with characteristics related not only to simple display of images, but also to display of images taking into consideration three-dimensional effects and sensory immersion. In order to meet such various requirements, research is being conducted to provide various display apparatuses having improved structures.

SUMMARY

Therefore, one object is to provide a display apparatus having an improved structure capable of achieving an enhancement in sensory immersion of a user.

In accordance with one aspect, the above and other objects may be accomplished by the provision of a display apparatus including a display module including a flexible display panel for displaying an image, and a variable member for varying a shape of the flexible display panel, wherein the variable member includes at least one variable section capable of varying in shape, and at least one driver for supplying mechanical energy to bend the shape of the variable section, where the flexible display panel is varied in shape by the bending in shape of the variable section.

BRIEF DESCRIPTION OF THE DRAWINGS

The above and other objects, features and other advantages will be more clearly understood from the following detailed description taken in conjunction with the accompanying drawings, in which.

DETAILED DESCRIPTION OF THE PREFERRED EMBODIMENTS

Figure 1:
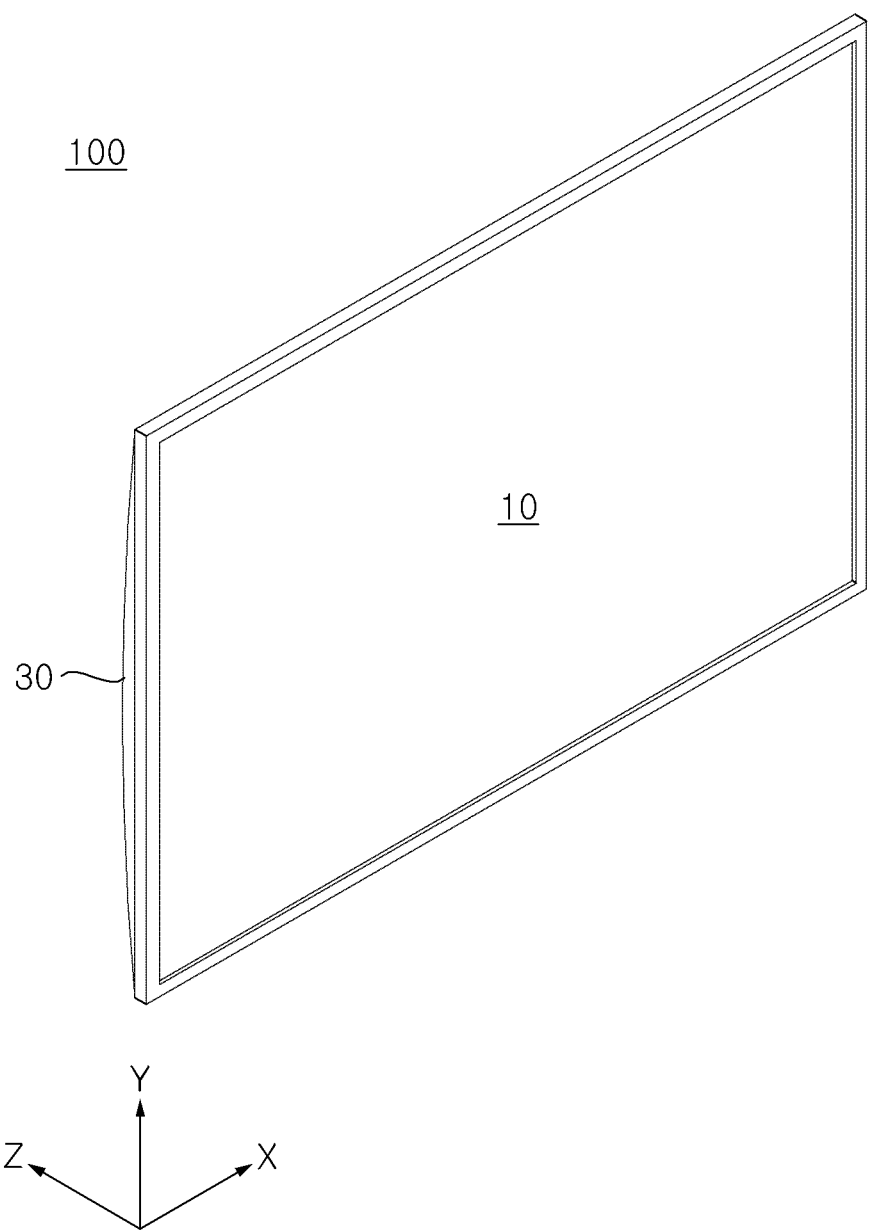
FIG. 1 is a front perspective view of a display apparatus according to an exemplary embodiment of the present invention.

Reference will now be made in detail to preferred embodiments of the present invention, examples of which are illustrated in the accompanying drawings. These embodiments are not intended to limit the present invention. Other embodiments may also be provided.

Constituent elements other than elements constituting essential features of the present invention may be omitted from the drawings, for clarity of description. Like reference numerals refer to like elements throughout. In the drawings, the widths, thicknesses, and etc., of constituent elements may be exaggerated or reduced for clarity and convenience of illustration. The present invention is not limited to the illustrated thicknesses, widths, and etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments, it will be understood that when a layer (or film), a region, a pad, a pattern or a structure is referred to as being disposed 'on/above/over' another layer, region, pad, pattern or structure, it can be directly in contact with another layer, region, pad, pattern or structure, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Hereinafter, a display apparatus according to an exemplary embodiment of the present invention will be described in detail with reference to the accompanying drawings.

Figure 2:
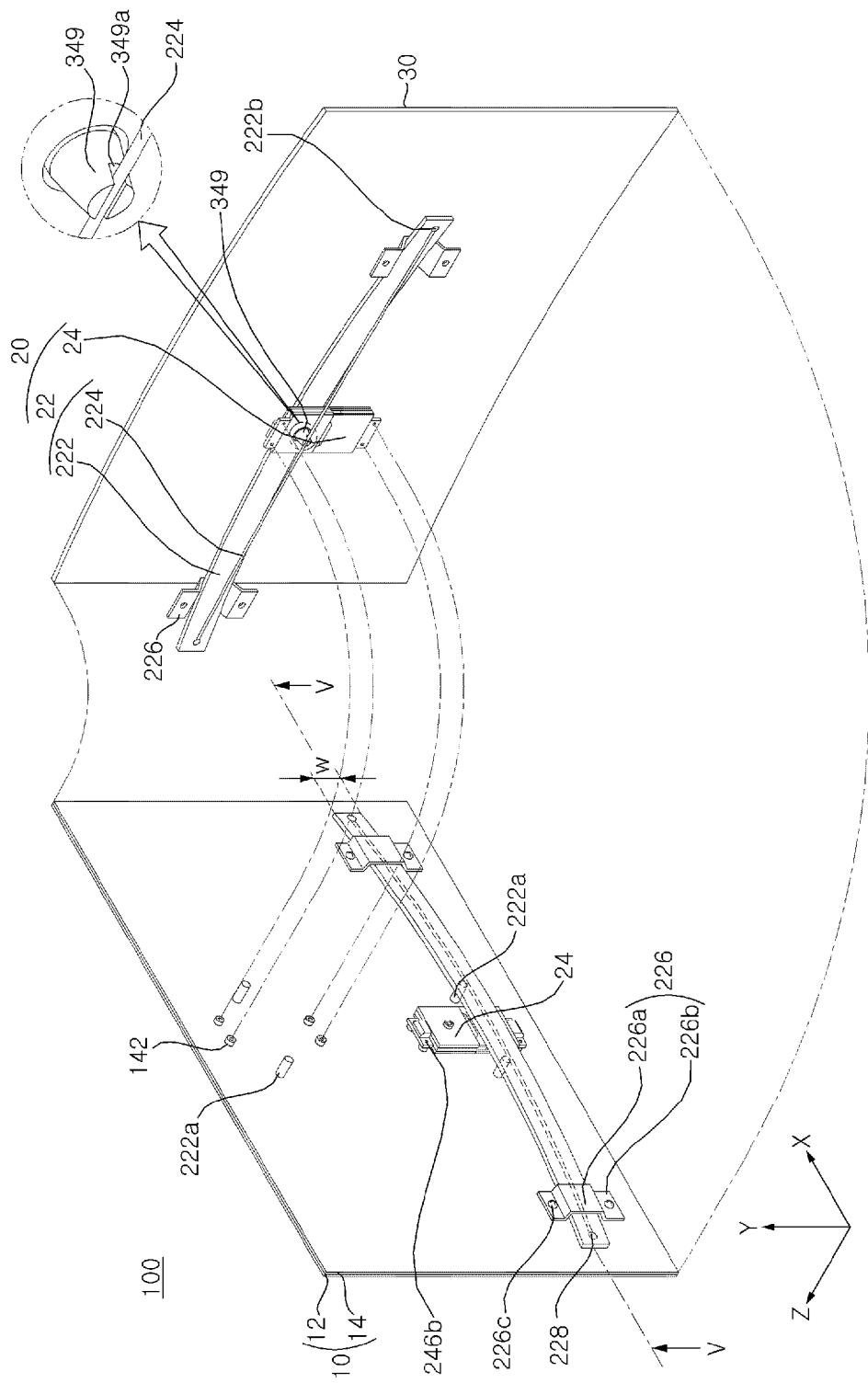
FIG. 2 is an exploded rear perspective view of the display apparatus according to an exemplary embodiment of the present invention.

FIG. 1 is a front perspective view of a display apparatus according to an exemplary embodiment of the present invention. FIG. 2 is an exploded rear perspective view of the display apparatus according to an exemplary embodiment of the present invention.

Referring to FIGS. 1 and 2, the display apparatus of the illustrated embodiment, which is designated by reference numeral "100", includes a display module 10 for displaying an image, and a variable member 20 for varying the shape of the display module 10. The display apparatus 100 also includes a rear cover 30 for covering a rear surface of the display module 10. This will be described in more detail.

The display module 10 may include a display panel 12 for displaying an image, a support member 14 disposed at a rear surface of the display panel 12, to support the display panel 12, and a panel driver (not shown) fixed to the support member 14, to provide signals for driving of the display panel 12. Although not shown, the display module 10 may further include frames for enclosing edges of the display panel 12 and support member 14.

In an exemplary embodiment, the display panel 12 may be a panel not only having various structures and types capable of displaying an image, but also having flexibility, to be varied in shape by the variable member 20.

For example, the display panel 12 may be an organic light emitting display panel using organic light emitting diodes (OLEDs). Such an organic light emitting display panel is a self-luminous display panel in which electrons and holes are combined in a fluorescent or phosphorescent organic thin film when current flows through the organic thin film, thereby generating light. The organic light emitting display panel has various advantages such as excellent picture quality capable of providing bright and crisp images, no restriction as to viewing angle, and low power consumption. In particular, the organic light emitting display panel exhibits excellent flexibility in that it can be manufactured through lamination of organic thin films. Of course, the present invention is not limited to such a display panel. For the display panel 12, various display panels having various structures and types may be employed.

The support member 14, which is disposed at the rear surface of the display panel 12, supports the display panel 12. The panel driver and variable member 20 may be fixed to a rear surface of the support member 14. As described above, the panel driver drives the display panel 12. To this end, the support member 14 not only has strength to firmly support the display panel 12, panel driver and variable member 20, but also has flexibility and elasticity to be varied in shape in accordance with variation in the shape of the display panel 12. In order to avoid thermal stress, the support member 14 may have a coefficient of thermal expansion similar to that of the display panel 12.

For example, in an exemplary embodiment, the support member 14 may include a composite material such as reinforced plastic. Here, the composite material is a material obtained by artificially combining two or more kinds of materials, to exhibit excellent characteristics. For example, the support member 14 may include carbon fiber reinforced plastic (CFRP), glass fiber reinforced plastic (GFRP) or the like. In this case, the support member 14 may exhibit not only characteristics of lightness and flexibility by virtue of the plastic, but also high strength, high elasticity and excellent wear resistance by virtue of the fiber type reinforcing material. The support member 14 may be constituted by a single composite material layer or may be constituted by a plurality composite material layers, to exhibit excellent strength.

The support member 14 may be fixed to the rear surface of the display panel 12 by an adhesive (for example, a double-sided tape). Of course, the present invention is not limited to such a fixing method. The display panel 12 and support member 14 may be fixed to each other, using various fixing methods.

The panel driver fixed to the rear surface of the support member 14 includes a circuit board (not shown) including various wirings and elements to provide signals for driving the display panel 12. The panel driver may be fixed to the support member 14 by a bracket (not shown) or the like. For example, the bracket may be fixed to the support member 14 at a middle portion thereof in order to minimize force required to vary the shape of the display panel 12. Of course, the present invention is not limited to such a structure, and various alternatives may be employed. For example, the panel driver may be partially or completely disposed at the outside of the display module 10. In an exemplary embodiment, the panel driver may include wirings, elements, and etc., for driving the variable member 20.

In addition, frames may be provided to protect the edges of the display panel 12 and support member 14. Such frames not only protect the display panel 12 and support member 14, but also support the rear cover 30. That is, the rear cover 30 may be fastened to the frames by fastening members (not shown). The frames may have various shapes, and various fastening structures and methods may be employed to fasten the rear cover to the frames and, as such, no detailed description thereof will be given.

The variable member 20 is disposed at the display module 10 (in this embodiment, the variable member 20 is disposed at the rear surface of the support member 14), to vary the shape of the display panel 12. The variable member 20 may include a variable section 22, and a driver 24 for supplying mechanical energy to vary the shape of the variable section 22. For example, the driver 24 varies the shape of the variable section 22 by bending in shape the variable section 22.

Figure 5:
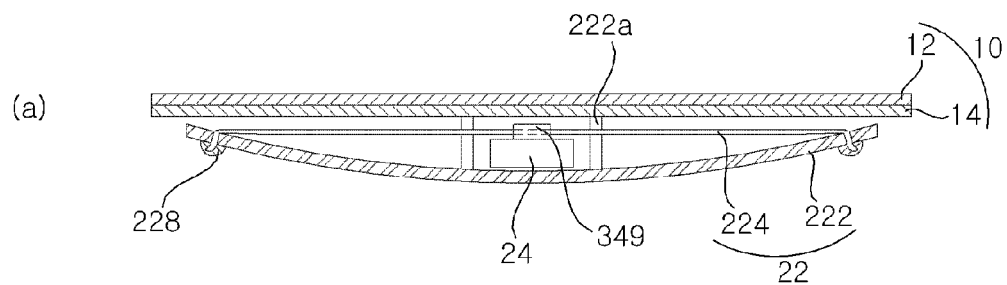
FIGS. 5(a) and 5(b) are views explaining shape variation of the display apparatus according to an exemplary embodiment of the present invention.
Figure 5:
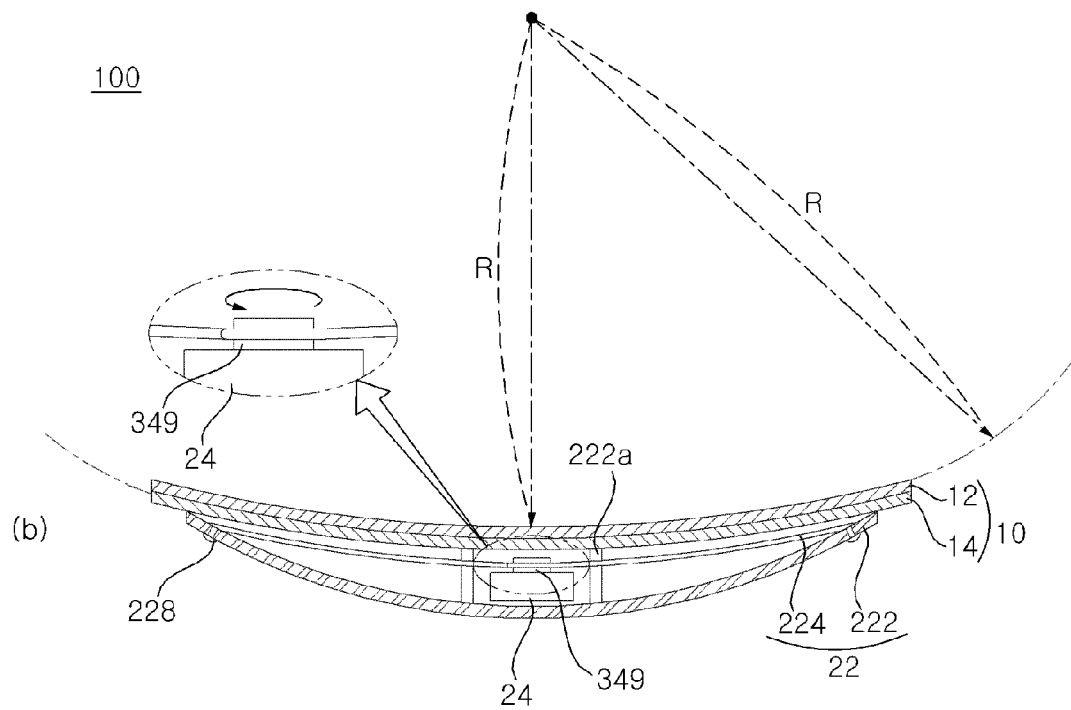

In an exemplary embodiment, the variable section 22 may be elongated in one direction (for example, a lateral direction of the display apparatus 100). Upon receiving mechanical energy from the driver 24, the variable section 22 may be varied in shape such that opposite end portions thereof protrude forward with respect to the middle portion (comment: since the middle portion is fixed to the display panel, see FIGS. 2 and 5, it does not appear to retract rearward). As a result, the display module 10 may be bent throughout the entirety thereof, to have a predetermined radius of curvature (for example, "R" in FIG. 5(b)) in a lateral direction of the display module 10. In this state in FIG. 5(b), there is no difference in the distance from the eyes of the user to the display panel 12 between the middle and lateral end portions of the display panel 12. Even if there is a distance difference, such difference may be minute. Thus, it is possible to achieve an enhancement in sensory immersion of the user. Of course, the present invention is not limited to the above-described embodiment. For example, the varied shape of the variable section 22 may be different from the above-described shape and, as such, the varied shape of the display module 10 may also be different from the above-described shape.

In the illustrated embodiment, two variable sections 22 are provided such that one variable section 22 is disposed at an upper portion of the display module 10, and the other variable section 22 is disposed at a lower portion of the display module 10. While two or more variable section 22 are preferred, a single variable section 22 may be disposed at an intermediate portion of the display module 10, although insufficient shape variation may occur at lateral edge portions of the display module 10. Taking into such consideration, in this embodiment, two variable sections 22 are implemented. When a plurality of variable sections 22 are provided, it is possible to achieve uniform shape variation throughout the entirety of the display module 10. Of course, the present invention is not limited to the two variable sections 22, and various alternatives may be employed. For example, only one variable section 22 is provided for cost reduction and structure simplification.

Each variable section 22 may include a first portion 222 fixed to the support member 14 of the display module 10, and a second portion 224 disposed between the support member 14 and the first portion 222. The second portion 224 is fixed, at opposite ends thereof, to opposite ends of the first portion 222, respectively.

The second portion 224 is fixed, at a certain region thereof, for example, a central region, to the driver 24 and, as such, the second portion 224 has a connection length (that is, a rectilinear length between the opposite ends of the first portion 222 connected with the second portion 224) variable by mechanical energy supplied from the driver 24. When the connection length of the second portion 224 varies, the shape of the first portion 222 is varied. This will be described in more detail later with reference to FIGS. 5(a) and 5(b). When the shape of the first portion 222 varies, the first portion 222 applies force to the display module 10, thereby causing the shape of the display module 10 to be correspondingly varied.

Thus, the first portion 222 is a portion which is varied in shape by force received from the second portion 224, thereby varying the shape of the display module 10. In this regard, the first portion 222 may include a material having flexibility and excellent strength. In addition, the material of the first portion 222 may be light in weight in order to reduce the weight of the display apparatus 100.

For example, the first portion 222 may include a single layer structure or a multilayer structure, which includes a composite material, for example, reinforced plastic (CFRP, GFRP or the like). Of course, the present invention is not limited to such materials, and the first portion 222 may be made of various materials. The first portion 222 may have an elongated band shape having a certain width W. Accordingly, it is possible to more effectively apply force to the display module 10. Of course, the present invention is not limited to such a shape, and the first portion 222 may have various shapes.

The first portion 222 is fixed, at a central region thereof, to the display module 10 (in this embodiment, the support member 14) such that it cannot move at the central region. In this case, the first portion 222 is movable at opposite end regions thereof. Since the first portion 222 is movable (in this case, forward and rearward) at the opposite end regions thereof while being fixed at the central region thereof, the shape of the first portion 222 is variable.

The first portion 222 is fixed at the central region thereof by fixing members 222a such that it cannot move. The distance between the central region of the first portion 222 and the support member 14 may be greater than the distance between each end region of the first portion 222 and the support member 14. For example, the first portion 222 may be disposed on the support member 14 such that the central region of the first portion 222 is further protruded rearward from the display module 10, as compared to other regions of the first portion 222 and, as such, the first portion 222 has a curved structure. Then, as an example in accordance with FIG. 5(b), when the display module 10 is varied in shape to have a predetermined radius of curvature R throughout the entirety thereof in accordance with variation in the length of the second portion 224 by the driver 24, the shape variation can be more easily achieved. Each fixing member 222a may be constituted by a fastener such as a PEM nut or a screw. Using a PEM nut or a screw, it is possible to achieve simple and easy fastening. Of course, the present invention is not limited to the above-described structures, and various fixing methods and structures may be employed for fixing of the first portion 222 to the support member 14.

The opposite end regions of the first portion 222 may be movably held by guide members 226 fixed to the support member 14, respectively. Accordingly, it is possible to movably hold the first portion 222 while preventing the first portion 222 from being downwardly bent at the opposite end regions thereof.

Each guide member 226 includes an upper portion 226a spaced from the support member 14, to form a predetermined space therebetween, and side portions 226b bent from the upper portion 226a, to be disposed adjacent to the support member 14. The side portions 226b are fixed to the support member 14 by fastening members 226c. For example, fixing of each guide member 226 to the support member 14 may be achieved by mounting PEM nuts 142 to the support member 14, and fastening the fastening members 226c, which may be screws, to the PEM nuts 142 through fastening holes formed at the side portions 226b. Using the PEM nuts and screws as described above, it is possible to easily and simply achieve fastening. Of course, the present invention is not limited to the above-described structures, and various fixing methods and structures may be employed for fixing of the side portions 226b to the support member 14.

The second portion 224 may have a wire structure, and may be fixed, at opposite ends thereof, to the opposite ends of the first portion 222, respectively. The second portion 224 is coupled to a rotating shaft 349 of the driver 24, and a portion of the second portion 224 can be wound on or unwound from the rotating shaft 349, to vary the connection length of the second portion 224. This will be described in more detail later.

Each end of the second portion 224 may be fixed to the first portion 222 by a fixing member 228 such as an adhesive or a seal after extending through a hole 222b formed at the corresponding end of the first portion 222. Of course, the present invention is not limited to the above-described method, and various fixing methods may be employed for fixing of the second portion 224 to the first portion 222.

The second portion 224 may be made of a material exhibiting little or no stretchability even under diverse conditions while having high yield strength. When the second portion 224 is stretchable, it is difficult to accurately vary the connection length of the second portion 224. In addition, it may be necessary to provide increased mechanical energy. For example, the second portion 224 may include a metal steel wire (for example, a stainless wire), an aramid fiber, a carbon steel wire or the like. The second portion 224 may have a diameter of 0.5 to 10 mm. When the diameter of the second portion 224 is less than 0.5 mm, there may be a problem in that the second portion 224 may snap or deform upon receiving energy from the driver 24. On the other hand, when the diameter of the second portion 224 exceeds 10 mm, there may be problems of increased costs and complicated configurations because mechanical energy required to vary the connection length of the second portion 224 should be increased. Of course, the present invention is not limited to the above-described embodiment, and the second portion 224 may include various materials and may have various diameters. Although only one second portion 224 is provided in association with the first portion 222 in the illustrated embodiment, a plurality of second portions 224 may be provided. That is, various alternatives may be employed.

The driver 24 which supplies mechanical energy may have various configurations capable of varying the shape of the variable section 22. Since the driver 24 varies the shape of the variable section 22, using mechanical energy, it is possible to easily vary the shape of the variable section 22 while accurately controlling the variation degree and variation time of the variable section 22. The driver 24 will be described in more detail with reference to FIGS. 3 and 4.

Figure 3:
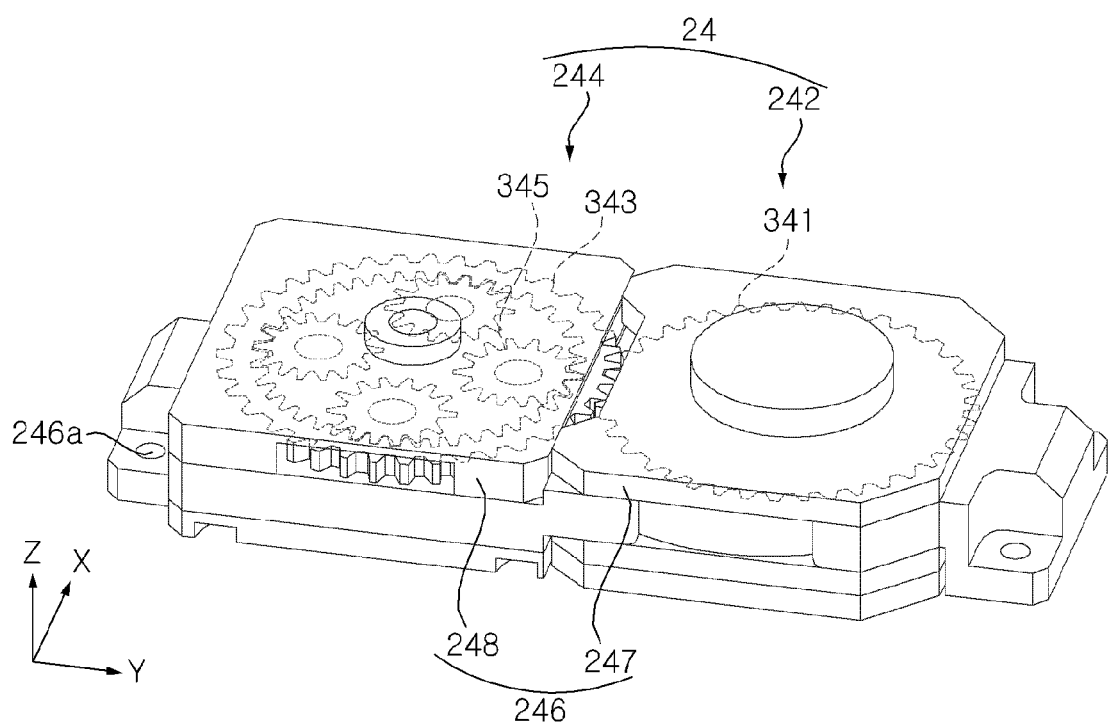
FIG. 3 is a perspective view illustrating a driver of the display apparatus according to an exemplary embodiment of the present invention.
Figure 4:
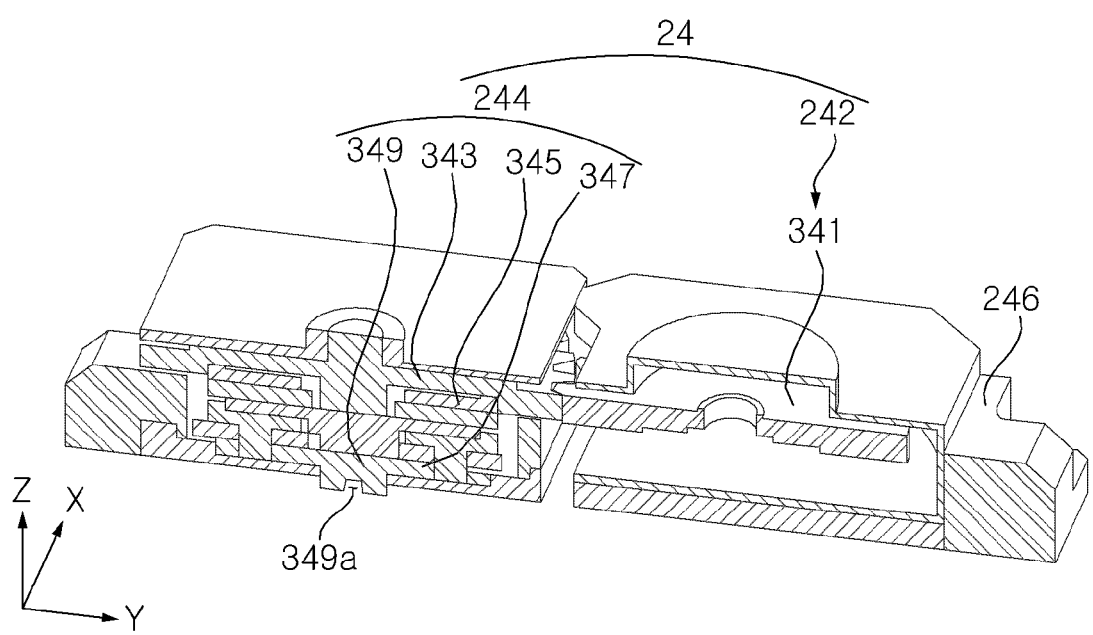
FIG. 4 is a cross-sectional perspective view of the driver corresponding to FIG. 3.

FIG. 3 is a perspective view illustrating a configuration of the driver of the display apparatus according to an exemplary embodiment of the present invention. FIG. 4 is a cross-sectional perspective view of the driver corresponding to FIG. 3.

In the illustrated embodiment, the driver 24 may include a motor 242 for supplying rotational energy. As the motor 242, an ultrasonic motor may be employed. The ultrasonic motor is a motor in which frictional force generated between a vibration body vibrating using ultrasonic vibration and a mover is converted into rotational force. This motor is also called a "piezoelectric motor" in that it utilizes piezoelectric effects of piezoelectric ceramics.

The ultrasonic motor may generate great force while exhibiting a rapid response rate that is 10 times or more than that of existing electromagnetic motors. The ultrasonic motor does not generate noise during operation because it employs ultrasonic waves within an inaudible range. In addition, the ultrasonic motor may have a small size because the structure thereof is simple. The ultrasonic motor has no adverse influence on the display module 10 during operation of the display apparatus 100 because it does not include a magnet. The holding torque of the ultrasonic motor, namely, the torque to stop the ultrasonic motor, is great and, as such, no reverse rotation is generated even when no voltage is applied. Accordingly, it is possible to maintain the display module in a shape-varied state without supplying separate electric power or the like. Thus, it is possible to achieve an enhancement in stability during shape variation of the display module 10. In addition, it is possible to achieve a simplified configuration because it is unnecessary to provide a separate configuration for maintaining the shape-varied state.

The driver 24 may further include a reducer 244 for reducing the speed of the motor 242, for example, using reduction ratios, thereby increasing rotational energy supplied by the motor 242. Using the reducer 244, it is also possible to greatly reduce the size of the motor 242. The reduction ratios may be performed using gears. The reduction ratio of the reducer 244 may be 1:2 to 1:300. This range is a range within which the motor 242 can supply mechanical energy capable of sufficiently varying the shape of the variable section 22 while having a minimum size. Of course, the reduction ratio of the reducer 244 may be varied in accordance with the kind of the motor 242, the structure and system of the variable section 22, or the like.

In the illustrated embodiment, the motor 242 and reducer 244 are disposed within a housing 246.

When the housing 246 is employed, it is possible to simplify the structure of the driver 24. Fixing of the driver 24 can be easily achieved by coupling fastening members 246b into fastening holes 246a of the housing 246, thereby fastening the housing 246 to the support member 14. In this case, PEM nuts (not shown), to which the fastening members 246b will be fastened, may be provided at the support member 14. In the illustrated case, the housing 246 includes a first housing section 247, in which the motor 242 is disposed, and a second housing section 248, in which the reducer 244 is disposed. Accordingly, the motor 242 and reducer 244 are prevented from interfering with each other. Of course, the present invention is not limited to the illustrated embodiment, and various alternatives may be employed. For example, both the motor 242 and the reducer 244 may be accommodated within a single housing section.

It is possible to reduce the thickness of the driver 24 by arranging the motor 242 and reducer 244 in parallel in the housing 246. In this case, accordingly, it is possible to install the driver 24 without increasing the thickness of the display apparatus 100. For example, in an exemplary embodiment, a part of the housing 246, in particular, the housing section accommodating the reducer 244, may be interposed between the display module 10 and the first portion 222 of the corresponding variable section 22. In this case, the second portion 224 of the variable section 22 is coupled to the rotating shaft 349 of the reducer 244 and, as such, it is possible to adjust the connection length of the second portion 224 by winding or unwinding a portion of the second portion 224 on or from the rotating shaft 349. In this arrangement, there is also an advantage in terms of space. Of course, the present invention is not limited to such an arrangement. For example, the driver 24 may be spaced from the variable section 22. This will be described in more detail later.

The motor 242 includes a motor gear 341. The reducer 246 includes a ring gear 343 engaged with the motor gear 341, a plurality of planetary gears 345 engaged with the ring gear 343 within the ring gear 343, and a sun gear 347 engaged with the planetary gears 345. The rotating shaft 349, which is also included in the reducer 246, is coupled to the sun gear 347. The rotating shaft 349 includes a fixing portion 349a to which the second portion 224 is fixed. When the motor gear 341 of the motor 24 rotates, the ring gear 343 engaged with the motor gear 341 rotates, thereby rotating the planetary gears 345 and sun gear 347. Accordingly, the rotating shaft 349 is rotated. The planetary gears 345 may be arranged in multi-layers so as to achieve an increase in reduction ratio.

The rotating shaft 349 is protruded outwards of the housing 246 toward the display module 10. A recessed fixing portion 349a is formed at a protruded end of the rotating shaft 349. The second portion 224 is engaged, at a central region thereof, in the recessed fixing portion 349a. Accordingly, the second portion 224 is coupled to the rotating shaft 349. Thus, it is possible to easily couple the second portion 224 to the rotating shaft 349 without a separate configuration by forming the recessed fixing portion 349a at the rotating shaft 349. Of course, the present invention is not limited to the above-described embodiment, and various alternatives may be employed. For example, the fixing portion 349a may have various structures. The fixing portion 349a may also be provided separately from the rotating shaft 349.

Although not shown, a guide path to guide winding of the second portion 224 may be formed on an outer surface of the rotating shaft 349. In this case, the second section 224 can be more stably wound on the rotating shaft 349 using the guide path.

Although one driver 24 is provided for each of the plural variable sections 22 in the illustrated embodiment, the present invention is not limited thereto. Alternatively, the plural variable sections 22 may be driven by one driver 24. This will be described in more detail later with reference to FIG. 6. Although a planetary gear reducer is employed as the reducer 244 in the illustrated embodiment, various structure and systems may be employed for the reducer 244.

The rear cover 30 is disposed in rear of the display module 10 and variable member 20. The rear cover 30 protects the display module 10, panel driver, and etc., from external impact while providing a space where the panel driver, and etc., are disposed. The rear cover 30 also covers the panel driver, and etc., to prevent an inner configuration of the display module 10 from being outwardly exposed, and thus to achieve an enhancement in appearance. For example, the rear cover 30 has a surface gently curved throughout the rear cover 30, to secure a sufficient space and to achieve an enhancement in appearance. In an exemplary embodiment, the rear cover 30 includes a material, a structure, or the like capable of coping with a variation in shape of the display module 10.

The above-described shape variation of the display apparatus 100 will be described in more detail with reference to FIGS. 5(a) and 5(b). FIGS. 5(a) and 5(b) are views explaining shape variation of the display apparatus 100 according to an exemplary embodiment of the present invention. For reference, FIGS. 5(a) and 5(b) are cross-sectional views taken along the line V-V of FIG. 2. For simplicity and convenience of description, illustration of the guide member 226 and rear cover 30 is omitted from FIGS. 5(a) and 5(b). For convenience of description, the following description will be given in conjunction with one variable section 22.

The display module 10 is kept in a flat state, as shown in FIG. 5(a), when there is no force applied to the display module 10.

The first portion 222 of the variable section 22 is fixed at the central region thereof by the fixing members 222a such that it cannot move. The first portion 222 is also disposed such that the central region of the first portion 222 is further protruded rearward from the display module 10, as compared to other regions of the first portion 222. In accordance with this structure, shape variation of the display module 10 can be more easily achieved. The opposite end regions of the first portion 222 are movably held by the guide members ("226" in FIG. 2), respectively. The second portion 224 is fixed to the fixing portion ("349a" in FIG. 2) of the rotating shaft 349 in the driver 24.

When the user inputs a command to vary the shape of the display apparatus 100, the driver 24 is driven by an element, for example, included in the panel driver to drive the driver 24. For example, the motor 242 rotates to rotate the rotating shaft 349 of the reducer 244. Accordingly, the second portion 224 fixed to the rotating shaft 349 is rotated together with the rotating shaft 349 and, as such, a portion of the second portion 224 is wound on the rotating shaft 349. As a result, the connection length of the second portion 224 is reduced, thereby reducing the rectilinear distance between the opposite ends of the first portion 222. Thus, the first portion 222 is bent throughout the entirety thereof such that the opposite end regions thereof protrude forward and, as such, the shape of the display module 10 is also varied. For example, the display module 10 is varied into a curved structure having a uniform radius of curvature R in the lateral direction of the display module 10, as shown in FIG. 5(b). Thus, the display module 10 provides an enhancement in sensory immersion of the user.

When the user inputs a command again to revert the shape of the display module 10 back to its the original shape, the portion of the second portion 224 wound on the rotating shaft 349 is unwound. As such, the length of the second portion 224 is increased to its original length, and the display module 10 reverts to a flat state, as shown in FIG. 5(a). Accordingly, the variable section 22 is returned to an original state thereof.

Thus, in the illustrated embodiment, it is possible to vary the shape of the display module 10 in order to achieve an enhancement in sensory immersion of the user. Using the driver 24 which supplies mechanical energy for shape variation of the display module 10, it is possible to easily vary the shape of the variable section 22 while accurately controlling the shape variation degree and time of the variable section 22. In addition, since the motor 242 (in particular, the ultrasonic motor) and reducer 244 are employed for the driver 24, the driver 24 can have a small size. It is also possible to vary the shape of the display module 10 without generation of noise.

For reference, the command to vary the shape of the display apparatus 100 may be input to the display apparatus 100 by various methods. For example, the user may input the comment by pushing or pressing a button of the display apparatus, by using a device for a remote control (for example, a remote controller of the display apparatus 100), by moving a body of the user (such as, moving eyes of the user or applauding), and so on.

Hereinafter, a display apparatus according to another exemplary embodiment of the present invention will be described with reference to FIG. 6. With regard to the following embodiment, no description will be given of matters identical or very similar to those of the above-described embodiments, and only the different matters will be described in detail.

Figure 6:
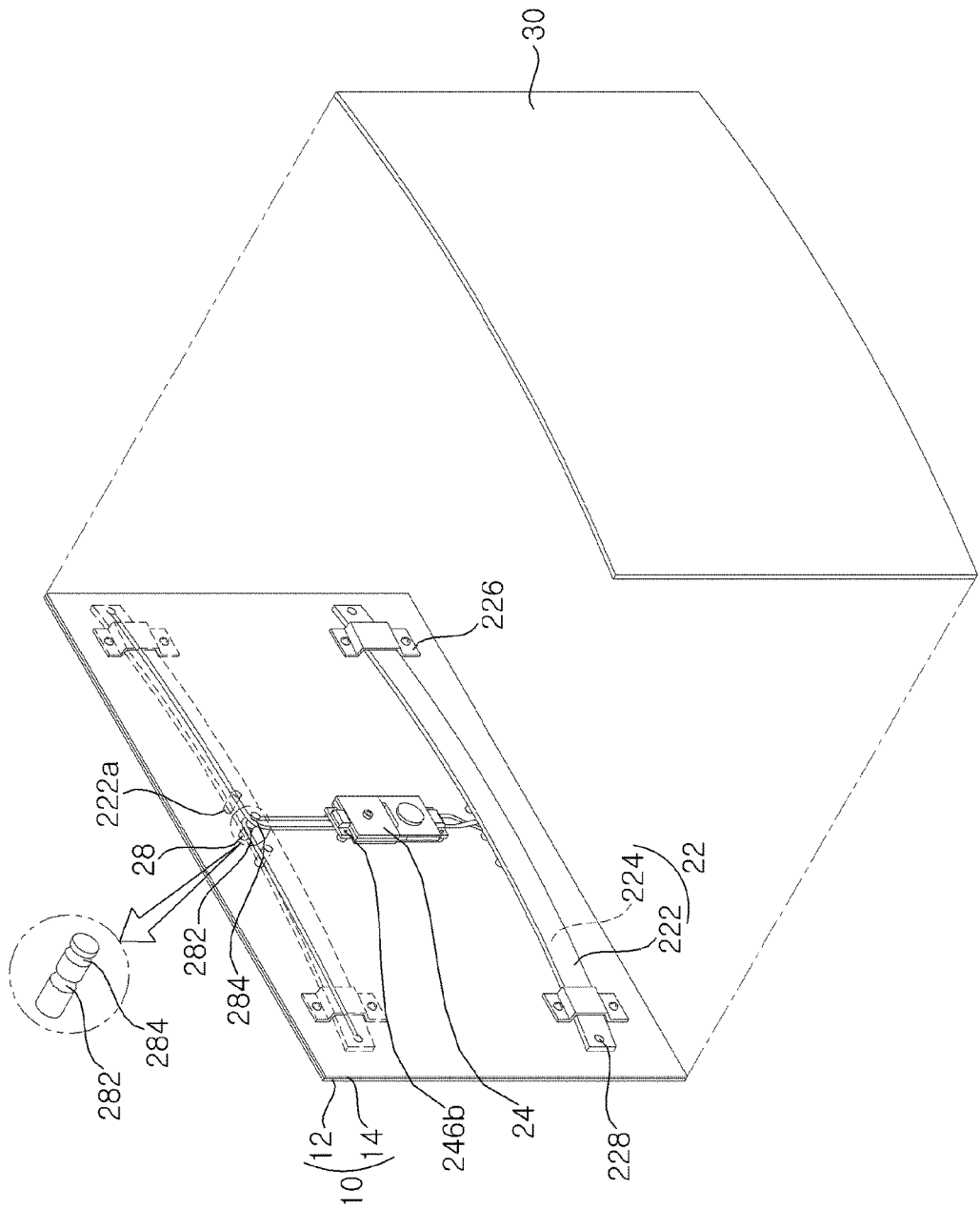
FIG. 6 is an exploded perspective view of a display apparatus according to another exemplary embodiment of the present invention.

FIG. 6 is an exploded perspective view of a display apparatus according to another exemplary embodiment of the present invention.

Referring to FIG. 6, in this embodiment, a plurality of variable sections 22 are provided, and one driver 24 drives the plural variable sections 22. For example, in this embodiment, the driver 24 is disposed to be spaced from the plural variable sections 22. A path change member 28 is disposed between each variable section 22 and the display module 10, to change a movement path of the second section 224 toward the driver 24. In the illustrated embodiment, the path change member 28 protrudes from the support member 14. The path change member 28 has a cylindrical shape, and does not rotate. The path change member 28 may be mounted to the support member 14, using a PEM nut, a screw or the like. Of course, the path change member 28 may be mounted to the support member 14 in accordance with various methods.

The path change member 28 may be formed with a first guide 282 to guide movement of one part of the second portion 224 extending between one end region of the first portion 222 and the driver 24, and a second guide 284 to guide movement of the other part of the second portion 224 extending between the other end region of the first portion 222 and the driver 24. Accordingly, the two parts of the second portion 224 do not interfere with each other during movement thereof. The first and second guides 282 and 284 may be grooves formed on an outer surface of the path change member 28, as shown in an enlarged circle of FIG. 6. Each second portions 224 of the variable sections 22 may be fixed to the rotating shaft ("349" in FIG. 2) of the driver under the condition that they are connected together. Thus, the connection lengths of each second portions 224 are simultaneously reduced or increased in accordance with rotation of the rotating shaft 349. Of course, the present invention is not limited to the above-described arrangement. In another exemplary embodiment, the second portions 224 of a plurality of the variable sections 22 may be connected together. In this instance, the second portions 224 connected together may be connected to the driver 24 under the condition that only the movement paths thereof are guided by the path change members 28. Alternatively, each path change member 28 may be rotatably mounted to the support member 14. Of course, various alternatives may be employed.

When a plurality of variable sections 22 are driven by one driver 24, as described above, it is possible to easily vary the shape of the display module 10 while achieving structure simplification.

As apparent from the above description, in the display apparatus according to the above-described embodiment, it is possible to vary the shape of the display module so as to achieve an enhancement in sensory immersion of the user. Using the driver which supplies mechanical energy for shape variation of the display module, it is possible to easily vary the shape of the variable section while accurately controlling the shape variation degree and time of the variable section. In addition, since the motor (in particular, the ultrasonic motor) and reducer are employed for the driver, the driver can have a small size. It is also possible to vary the shape of the display module without generation of noise.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising: a display module including a flexible display panel to display an image; and a variable member to vary a shape of the flexible display panel, wherein the variable member comprises at least one variable section capable of being varied in shape, and at least one driver to supply mechanical energy to vary the shape of the variable section, wherein-the variable section comprises a first portion fixed to the display module; and a second portion is fixed to the driver and fixed to opposite end portions of the first portion, wherein the first portion bends in shape by tension force of the second portion between the opposite end portions of the first portion, the flexible display panel includes a first state and a second state different from the first state by bending of the first portion; the second portion is fixed on a rotating shaft, and the second portion is variable in length in accordance with winding or unwinding of a portion of the second portion on or from the rotating shaft driven by at least one gear.

2. The display apparatus according to claim 1, wherein the flexible display panel is varied by the variable member to correspond to the shape of the variable section.

3. The display apparatus according to claim 1, wherein the second portion has a connection length variable by the driver to thereby bend a shape of the first portion.

4. The display apparatus according to claim 3, wherein the connection length is a rectilinear length between opposite ends of the second portion.

5. The display apparatus according to claim 1, wherein the second portion has a wire shape.

6. The display apparatus according to claim 1, wherein:
the first portion comprises a composite material; and
the second portion comprises one of a metal wire, a non-metal wire, or a composite wire.

7. The display apparatus according to claim 1, wherein:
the first portion is elongated in one direction; and
the first portion is fixed, at a central region thereof, at the display module such that the first portion does not move at the central region.

8. The display apparatus according to claim 7, wherein the first portion is movably fixed, at end regions thereof, by guide members fixed at the display module, respectively.

9. The display apparatus according to claim 1, wherein the driver comprises an ultrasonic motor.

10. The display apparatus according to claim 1, wherein:
the driver comprises a rotating shaft rotatable by a rotating force from a motor;
the second portion is fixed on the rotating shaft, and has a connection length variable in accordance with winding or unwinding of a portion of the second portion on or from the rotating shaft.

11. The display apparatus according to claim 10, wherein:
a fixing portion is formed at an end portion of the rotating shaft disposed toward the display module; and
the second portion is fixed on the fixing portion.

12. The display apparatus according to claim 1, wherein the driver further comprises;
a motor supplying rotational force, and
a reducer connected to the motor.

13. The display apparatus according to claim 1, wherein the second portion is fixed, at a central region, to the driver.

14. The display apparatus according to claim 1, wherein the second portion disposed between the display module and the first portion.

15. The display apparatus according to claim 12, further comprising:
a housing to house the motor and the reducer, the housing being fixed on the display module.

16. The display apparatus according to claim 10, wherein:
the rotating shaft is disposed between the first portion and the display module;
the rotating shaft is formed with a fixing portion at an end of the rotating shaft disposed adjacent to the display module; and
the second portion is fixed on the fixing portion.

17. The display apparatus according to claim 1, wherein:
the at least one variable section comprises a plurality of variable sections; and
the at least one driver comprises a motor to drive the plurality of variable sections.

18. The display apparatus according to claim 17, wherein:
the at least one variable section comprises a first portion fixed on the display module, and a second portion disposed between the display module and the first portion, and fixed on the first portion;
the motor is spaced from the variable section; and
a path change member is disposed between the at least one variable section and the display module, to change a movement path of the second portion toward the motor.

19. The display apparatus according to claim 1, wherein the display module comprises a support member located at a rear surface of the flexible display panel; and
the first portion fixed to the support member.

* * * * *